(12) United States Patent
Yi

(10) Patent No.: US 12,074,146 B2
(45) Date of Patent: Aug. 27, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 432 days.

(21) Appl. No.: 17/597,024

(22) PCT Filed: Dec. 13, 2021

(86) PCT No.: PCT/CN2021/137329
§ 371 (c)(1),
(2) Date: Dec. 22, 2021

(87) PCT Pub. No.: WO2023/097754
PCT Pub. Date: Jun. 8, 2023

(65) Prior Publication Data
US 2023/0178522 A1    Jun. 8, 2023

(30) Foreign Application Priority Data
Dec. 3, 2021 (CN) .......................... 202111467260.6

(51) Int. Cl.
*H01L 27/15* (2006.01)
*H01L 25/075* (2006.01)
(Continued)

(52) U.S. Cl.
CPC ........ *H01L 25/0753* (2013.01); *H01L 33/005* (2013.01); *H01L 33/382* (2013.01);
(Continued)

(58) Field of Classification Search
None
See application file for complete search history.

(56) References Cited

U.S. PATENT DOCUMENTS

2018/0175268 A1* 6/2018 Moon .................. H01L 27/15
2019/0334060 A1* 10/2019 Zou ..................... H01L 33/405
(Continued)

FOREIGN PATENT DOCUMENTS

CN         107170772 A      9/2017
CN         206557511 U     10/2017
(Continued)

OTHER PUBLICATIONS

International Search Report issued in PCT/CN2021/137329, mailed on May 24, 2022, with English translation.
(Continued)

*Primary Examiner* — Benjamin P Sandvik
(74) *Attorney, Agent, or Firm* — HSML P. C.

(57) ABSTRACT

A display panel and a manufacturing method thereof are disclosed. The display panel includes a substrate, a light extraction structure, and a thin film transistor array layer. The light extraction structure includes a plurality of light emitting diode (LED) chips, a first light extraction portion, a second light extraction portion, and a first metal layer. The second light extraction portion covers the first light extraction portion and the LED chips. Light achieves total reflection after passing through the first light extraction portion and the second light extraction portion and then irradiating a sidewall of the first metal layer, improving the light exit efficiency at a front viewing angle.

20 Claims, 6 Drawing Sheets

(51) Int. Cl.
  *H01L 33/00*   (2010.01)
  *H01L 33/38*   (2010.01)
  *H01L 33/62*   (2010.01)

(52) U.S. Cl.
  CPC ...... *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2020/0119244 A1* | 4/2020 | Kwon | H01L 33/62 |
| 2020/0135971 A1 | 4/2020 | Beak et al. | |
| 2020/0161499 A1 | 5/2020 | Ota et al. | |
| 2021/0217805 A1* | 7/2021 | Kusunoki | H01L 27/1266 |
| 2023/0170451 A1* | 6/2023 | Jin | H01L 25/0753 257/79 |
| 2023/0215907 A1* | 7/2023 | Akimoto | H01L 27/156 257/72 |
| 2023/0230957 A1* | 7/2023 | Kim | H01L 25/167 345/690 |
| 2023/0290808 A1* | 9/2023 | Akimoto | G09F 9/30 |
| 2023/0343813 A1* | 10/2023 | Akimoto | H01L 33/60 |

FOREIGN PATENT DOCUMENTS

| | | |
|---|---|---|
| CN | 107425041 A | 12/2017 |
| CN | 109273479 A | 1/2019 |
| CN | 109671732 A | 4/2019 |
| CN | 109991779 A | 7/2019 |
| CN | 111341682 A | 6/2020 |
| CN | 112309990 A | 2/2021 |
| CN | 112310142 A | 2/2021 |
| CN | 112447786 A | 3/2021 |
| CN | 112993132 A | 6/2021 |
| CN | 113345927 A | 9/2021 |
| IN | 108538888 A | 9/2018 |
| JP | 2014197475 A | 10/2014 |

OTHER PUBLICATIONS

Written Opinion issued in PCT/CN2021/137329, mailed on May 24, 2022, with English translation.

Chinese Office Action issued in corresponding Chinese Patent Application No. 202111467260.6 dated Apr. 30, 2023, with English translation.

* cited by examiner

DISPLAY PANEL AND MANUFACTURING METHOD THEREOF

FIELD OF INVENTION

The present disclosure relates to the field of display technologies, and in particular, to a display panel and a manufacturing method thereof.

BACKGROUND OF INVENTION

In order to over the weak bonding between light emitting diodes (LED) chip and a thin film transistor array layer, the LED chips are massively transferred to a substrate and then the thin film transistor array layer is formed on a side of the LED chips away from the substrate. In this way, the stability and the yield of the LED chips are enhanced, and the process difficulty is reduced. However, since the LED chips are packaged by means of self-packaging, and the LED chips emit light from all angles, the light exit efficiency at a front viewing angle is low, resulting in increasing power consumption of the display panel and thereby reducing the service time of a device.

SUMMARY OF INVENTION

Embodiments of the present disclosure provide a display panel and a manufacturing method thereof, to resolve the technical problem that a convention display panel and a manufacturing method thereof have low light exit efficiency at a front viewing angle of a light emitting diode (LED) chip.

To resolve the problem described above, technical solutions provided in the present disclosure are as follows:

The present disclosure provides a display panel, including:
  a substrate;
  a light extraction structure disposed on a side of the substrate and including: silicon oxide, or silicon nitride, or a multilayer film structure;
  a first light extraction portion disposed on the substrate;
  a plurality of light emitting diode (LED) chips located on a side of the first light extraction portion away from the substrate;
  a second light extraction portion covering the first light extraction portion and the LED chips; and
  a first metal layer covering peripheral sides of the first light extraction portion and the second light extraction portion; and
  a thin film transistor array layer disposed on a side of the first metal layer away from the substrate, wherein the thin film transistor array layer is electrically connected to the LED chips to drive the LED chips to emit light.

According to the display panel provided in the present disclosure, each of the LED chips includes a light emitting unit and a first electrode and a second electrode that are disposed on a side of the light emitting unit away from the substrate. The first metal layer is electrically connected to the first electrode through a first via penetrating the second light extraction portion, and the first metal layer is electrically connected to the second electrode through a second via penetrating the second light extraction portion.

According to the display panel provided in the present disclosure, the thin film transistor array layer includes a bonding connection layer and a driving function layer. The bonding connection layer is located on a side of the light extraction structure away from the substrate. The driving function layer is located on a side of the bonding connection layer away from the substrate and is electrically connected to the LED chips using the bonding connection layer.

According to the display panel provided in the present disclosure, the bonding connection layer includes:
  a first insulating layer covering the substrate and the first metal layer;
  a second metal layer located on a side of the first insulating layer away from the substrate, wherein the second metal layer is electrically connected to the first metal layer through a third via and a fourth via penetrating the first insulating layer; and
  a second insulating layer covering the first insulating layer and the second metal layer, wherein the driving function layer is located on a side of the second insulating layer away from the substrate.

According to the display panel provided in the present disclosure, the second metal layer includes a positive electrode trace and a low-potential power signal line that are spaced apart from each other. The positive electrode trace is electrically connected to the first electrode through the third via. The low-potential power signal line is electrically connected to the second electrode through the fourth via.

According to the display panel provided in the present disclosure, the driving function layer includes:
  a third insulating layer located on the side of the second insulating layer away from the substrate;
  a semiconductor layer located on a side of the third insulating layer away from the substrate;
  a first gate insulating layer covering the third insulating layer and the semiconductor layer;
  a first gate layer located on a side of the first gate insulating layer away from the substrate;
  a second gate insulating layer covering the first gate layer and the first gate insulating layer;
  a second gate layer located on the side of the first gate insulating layer away from the substrate;
  an interlayer dielectric layer covering the second gate layer and the second gate insulating layer;
  a first source/drain electrode metal layer located on a side of the interlayer dielectric layer away from the substrate, wherein the first source/drain electrode metal layer includes a source electrode, a drain electrode, and a signal trace, wherein the signal trace is electrically connected to the second metal layer through a fifth via penetrating the interlayer dielectric layer, the second gate insulating layer, the first gate insulating layer, and the third insulating layer, wherein the fifth via is in communication with the fourth via; and
  a first planarization layer covering the interlayer dielectric layer and the first source/drain electrode metal layer.

According to the display panel provided in the present disclosure, the driving function layer includes:
  a second source/drain electrode metal layer located on a side of the first planarization layer away from the substrate, wherein the second source/drain electrode metal layer is electrically connected to one of the source electrode or the drain electrode through a sixth via penetrating the first planarization layer; and
  a second planarization layer covering the first planarization layer and the second source/drain electrode metal layer.

According to the display panel provided in the present disclosure, the display panel further includes a fourth insulating layer located between the light extraction structure and the substrate.

According to the display panel provided in the present disclosure, a size of the first light extraction portion in a thickness direction of the display panel ranges from 1 micron to 30 microns.

According to the display panel provided in the present disclosure, a size of the second light extraction portion in a thickness direction of the display panel ranges from 1 micron to 30 microns.

The present disclosure provides a display panel, including:
- a substrate;
- a light extraction structure disposed on a side of the substrate and including:
- a first light extraction portion disposed on the substrate;
- a plurality of LED chips located on a side of the first light extraction portion away from the substrate;
- a second light extraction portion covering the first light extraction portion and the LED chips; and
- a first metal layer covering peripheral sides of the first light extraction portion and the second light extraction portion; and
- a thin film transistor array layer disposed on a side of the first metal layer away from the substrate.

The thin film transistor array layer is electrically connected to the LED chips to drive the LED chips to emit light.

According to the display panel provided in the present disclosure, each of the LED chips includes a light emitting unit and a first electrode and a second electrode that are disposed on a side of the light emitting unit away from the substrate. The first metal layer is electrically connected to the first electrode through a first via penetrating the second light extraction portion, and the first metal layer is electrically connected to the second electrode through a second via penetrating the second light extraction portion.

According to the display panel provided in the present disclosure, the thin film transistor array layer includes a bonding connection layer and a driving function layer. The bonding connection layer is located on a side of the light extraction structure away from the substrate. The driving function layer is located on a side of the bonding connection layer away from the substrate and is electrically connected to the LED chips using the bonding connection layer.

According to the display panel provided in the present disclosure, the bonding connection layer includes:
- a first insulating layer covering the substrate and the first metal layer;
- a second metal layer located on a side of the first insulating layer away from the substrate, wherein the second metal layer is electrically connected to the first metal layer through a third via and a fourth via penetrating the first insulating layer; and
- a second insulating layer covering the first insulating layer and the second metal layer, wherein the driving function layer is located on a side of the second insulating layer away from the substrate.

According to the display panel provided in the present disclosure, the driving function layer includes:
- a third insulating layer located on the side of the second insulating layer away from the substrate;
- a semiconductor layer located on a side of the third insulating layer away from the substrate;
- a first gate insulating layer covering the third insulating layer and the semiconductor layer;
- a first gate layer located on a side of the first gate insulating layer away from the substrate;
- a second gate insulating layer covering the first gate layer and the first gate insulating layer;
- a second gate layer located on the side of the first gate insulating layer away from the substrate;
- an interlayer dielectric layer covering the second gate layer and the second gate insulating layer;
- a first source/drain electrode metal layer located on a side of the interlayer dielectric layer away from the substrate, wherein the first source/drain electrode metal layer includes a source electrode, a drain electrode, and a signal trace, wherein the signal trace is electrically connected to the second metal layer though a fifth via penetrating the interlayer dielectric layer, the second gate insulating layer, the first gate insulating layer, and the third insulating layer, wherein the fifth via is in communication with the fourth via; and
- a first planarization layer covering the interlayer dielectric layer and the first source/drain electrode metal layer.

According to the display panel provided in the present disclosure, the driving function layer includes:
- a second source/drain electrode metal layer located on a side of the first planarization layer away from the substrate, wherein the second source/drain electrode metal layer is electrically connected to one of the source electrode or the drain electrode through a sixth via penetrating the first planarization layer; and
- a second planarization layer covering the first planarization layer and the second source/drain electrode metal layer.

According to the display panel provided in the present disclosure, the display panel further includes a fourth insulating layer located between the light extraction structure and the substrate.

According to the display panel provided in the present disclosure, a size of the first light extraction portion in a thickness direction of the display panel ranges from 1 micron to 30 microns.

The present disclosure provides a method for manufacturing a display panel, including steps of:
- providing a substrate;
- forming a first light extraction portion on a side of the substrate;
- massively transferring a plurality of light emitting diode (LED) chips to a side of the first light extraction portion away from the substrate;
- forming a second light extraction portion covering the first light extraction portion and the LED chips; and
- forming a first metal layer covering peripheral sides of the first light extraction portion and the second light extraction portion; and
- forming a thin film transistor array layer on a side of the first metal layer away from the substrate, wherein the thin film transistor array layer is electrically connected to the LED chips to drive the LED chips to emit light.

According to the manufacturing method provided in the present disclosure, before the step of forming the second light extraction portion, the manufacturing method further includes:
- inspecting the plurality of LED chips, determining whether there is a faulty LED chip, and if so, repairing the faulty LED chip.

The beneficial effects of the present disclosure are as follows: According to the present disclosure, the light extraction structure is disposed. By means of the first light extraction portion, the second light extraction portion, and the first metal layer of the light extraction structure, light emitted by the LED chips achieves total reflection and exits toward human eyes after passing through the first light extraction portion and the second light extraction portion and then irradiating a sidewall of the first metal layer. In this way, the light exit efficiency at the front viewing angle can be effectively enhanced, the power consumption of the display panel is reduced, and the service time of a device is prolonged.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person skilled in the art may still derive other drawings from these accompanying drawings without creative efforts.

REFERENCE NUMERALS

1. Substrate; 2. Light extraction structure; 3. Thin film transistor array layer; 4. Fourth insulating layer;

20. Light emitting diode (LED) chip; 201. Light emitting unit; 202. First electrode; 203. Second electrode; 21. First light extraction portion; 22. Second light extraction portion; 221. First via; 222. Second via; 23. First metal layer;

31. Bonding connection layer; 311. First insulating layer; 3111. Third via; 3112. Fourth via; 312. Second metal layer; 313. Second insulating layer;

32. Driving function layer; 321. Third insulating layer; 322. Semiconductor layer; 323. First gate insulating layer; 324. First gate layer; 325. Second gate insulating layer; 326. Second gate layer; 327. Interlayer dielectric layer; 328. First source/drain electrode metal layer; 3281. Source electrode; 3282. Drain electrode; 3283. Signal trace; 3284. Fifth via; 329. First planarization layer; 3210. Second source/drain electrode metal layer; 3211. Second planarization layer; 3212. Sixth via.

DETAILED DESCRIPTION OF PREFERRED EMBODIMENTS

The technical solutions in the embodiments of the present disclosure will be described below with reference to the accompanying drawings in the embodiments of the present disclosure. Obviously, the described embodiments are a part of the present disclosure, but not all of them. All other embodiments obtained by a person skilled in the art based on the embodiments of the present disclosure without creative efforts shall fall within the protection scope of the present disclosure. In addition, it should be understood that the specific implementations described herein are merely used to describe and explain the present disclosure, but are not intended to limit the present disclosure. In the present disclosure, without the contrary explanation, the nouns of locality such as "upper" and "lower" usually refer to upper and lower of an apparatus in actual use or an operating state, and specifically, to a drawing direction of the accompanying drawings; and "inside" and "outside" are for an outline of the apparatus.

Figure 1:
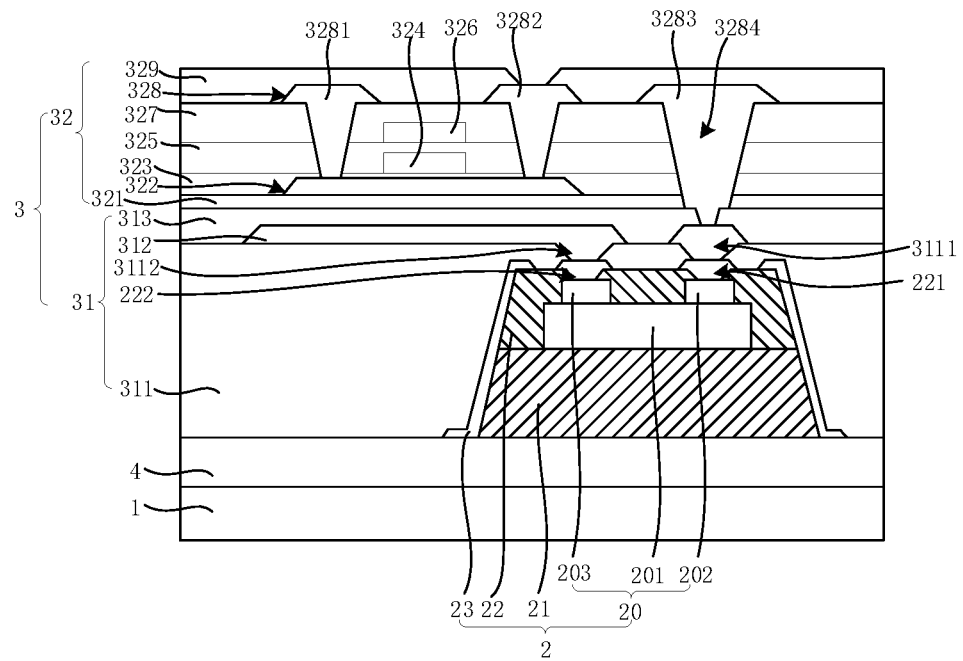
FIG. 1 is a schematic diagram of a cross-sectional structure of a display panel according to an embodiment of the present disclosure.

Referring to FIG. 1, FIG. 1 is a schematic diagram of a cross-sectional structure of a display panel according to an embodiment of the present disclosure. The embodiments of the present disclosure provide a display panel. The display panel includes a substrate 1, a light extraction structure 2, and a thin film transistor array layer 3.

The light extraction structure 2 includes a plurality of light emitting diode (LED) chips 20, a first light extraction portion 21, a second light extraction portion 22, and a first metal layer 23. The first light extraction portion 21 is located on the substrate 1. The LED chips 20 are located on a side of the first light extraction portion 21 away from the substrate 1. The second light extraction portion 22 covers the first light extraction portion 21 and the LED chips 20. The first metal layer 23 covers peripheral sides of the first light extraction portion 21 and the second light extraction portion 22. The thin film transistor array layer 3 is located on a side of the first metal layer 23 away from the substrate 1. The thin film transistor array layer 3 is electrically connected to the LED chips 20 to drive the LED chips 20 to emit light.

It may be understood that, in the present disclosure, the light extraction structure 2 is disposed. By means of the first light extraction portion 21, the second light extraction portion 22, and the first metal layer 23 of the light extraction structure 2, light emitted by the LED chips 20 achieves total reflection to avoid a shelter located at the thin film transistor array layer 3 and exits toward human eyes after passing through the first light extraction portion 21 and the second light extraction portion 22 and then irradiating a sidewall of the first metal layer 23. In this way, the light exit efficiency at the front viewing angle can be effectively enhanced, the power consumption of the display panel is reduced, and the service time of a device is prolonged.

Optionally, the first light extraction portion 21 may include a single layer or a plurality of layers. The first light extraction portion 21 may be made of an inorganic material or an organic material. For example, the inorganic material includes silicon oxide or silicon nitride or a multilayer thin film structure, and the organic material includes polyimide.

In detail, the first light extraction portion 21 is configured to cause the manufactured light extraction structure 2 to have an enough thickness, so that the light emitted by the LED chips 20 can be totally reflected to the front viewing direction. In the embodiments of the present disclosure, a thickness of the first light extraction portion 21 in a thickness direction of the display panel ranges from 1 micron to 30 microns.

It may be understood that, in addition to planarizing the LED chips 20, the second light extraction portion 22 can further package the LED chips 20. Since no additional packaging process is required, the production cost can be effectively reduced.

Optionally, the second light extraction portion 22 may include a single layer or a plurality of layers. The second light extraction portion 22 may be made of an inorganic material or an organic material. For example, the inorganic material includes silicon oxide or silicon nitride or a multilayer thin film structure, and the organic material includes polyimide.

In detail, a size of the second light extraction portion 22 in the thickness direction of the display panel ranges from 1 micron to 30 microns.

Optionally, the substrate 1 may be a rigid substrate. For example, a material for manufacturing the substrate 1 includes glass, quartz, ceramics, plastic, and the like. The substrate 1 may alternatively be a flexible substrate. For example, the material for manufacturing the substrate 1 includes polymer resins, such as polyimide or polyetherimide.

In detail, each of the LED chips 20 includes a light emitting unit 201 and a first electrode 202 and a second electrode 203 that are disposed on a side of the light emitting unit 201 away from the substrate 1. The first metal layer 23 is electrically connected to the first electrode 202 through a first via 221 penetrating the second light extraction portion 22. The first metal layer 23 is electrically connected to the second electrode 203 through a second via 222 penetrating the second light extraction portion 22.

In detail, the thin film transistor array layer 3 includes a bonding connection layer 31 and a driving function layer 32. The bonding connection layer 31 is located on a side of the light extraction structure away from the substrate 1. The driving function layer 32 is located on a side of the bonding connection layer 31 away from the substrate 1. The driving function layer 32 is electrically connected to the LED chips 20 using the bonding connection layer 31.

It is to be noted that, in the present disclosure, the LED chips 20 and the thin film transistor array layer 3 are successively disposed on a side of the substrate 1. In the prior art, the thin film transistor array layer 3 and the LED chips 20 are successively disposed on a side of the substrate 1. In the present disclosure, before the thin film transistor array layer 3 is manufactured, the LED chips 20 may be massively transferred to the side of the substrate 1, and after the mass transfer is finished, the thin film transistor array layer 3 is directly manufactured on a side of the LED chips 20 away from the substrate 1. Compared with the prior art, the thin film transistor array layer 3 is directly formed on the LED chips 20, and therefore the LED chips 20 are not required to be bound and connected to the thin film transistor array layer 3 by means of an anisotropic conductive adhesive bonding process or a metal bonding process during the mass transfer. In this way, the LED chips 20 can be firmly bonded to the thin film transistor array layer 3, improving the stability and the yield of the LED chips 20 and reducing the process difficulty.

In detail, the bonding connection layer 31 includes a first insulating layer 311, a second metal layer 312, and a second insulating layer 313. The first insulating layer 311 covers the substrate 1 and the first metal layer 23. The second metal layer 312 is located on a side of the first insulating layer 311 away from the substrate 1. The second metal layer 312 is electrically connected to the first metal layer 23 through a third via 3111 and a fourth via 3112 penetrating the first insulating layer 311. The second insulating layer 313 covers the first insulating layer 311 and the second metal layer 312. The driving function layer 32 is located on a side of the second insulating layer 313 away from the substrate 1.

In detail, the second metal layer 312 includes a positive electrode trace and a low-potential power signal line that are spaced apart from each other. The positive electrode trace is electrically connected to the first electrode 202 through the third via 3111. The low-potential power signal line is electrically connected to the second electrode 203 through the fourth via 3112.

In detail, the driving function layer 32 includes a third insulating layer 321, a semiconductor layer 322, a first gate insulating layer 323, a first gate layer 324, a second gate insulating layer 325, a second gate layer 326, an interlayer dielectric layer 327, a first source/drain electrode metal layer 328, and a first planarization layer 329. The third insulating layer 321 is located on the side of the second insulating layer 313 away from the substrate 1. The semiconductor layer 322 is located on a side of the third insulating layer 321 away from the substrate 1. The first gate insulating layer covers the third insulating layer 321 and the semiconductor layer 322. The first gate layer 324 is located on a side of the first gate insulating layer 323 away from the substrate 1. The second gate insulating layer 325 covers the first gate layer 324 and the first gate insulating layer 323. The second gate layer 326 is located on the side of the first gate insulating layer 323 away from the substrate 1. The interlayer dielectric layer 327 covers the second gate layer 326 and the second gate insulating layer 325. The first source/drain electrode metal layer 328 is located on a side of the interlayer dielectric layer 327 away from the substrate 1. The first source/drain electrode metal layer 328 includes a source electrode 3281, a drain electrode 3282, and a signal trace 3283. The signal trace 3283 is electrically connected to the second metal layer 312 through a fifth via 3284 penetrating the interlayer dielectric layer 327, the second gate insulating layer 325, the first gate insulating layer 323, and the third insulating layer 321. The fifth via 3284 is in communication with the fourth via 3112. The first planarization layer 329 covers the interlayer dielectric layer 327 and the first source/drain electrode metal layer 328. Optionally, the third insulating layer 321 may selectively be made of an inorganic material for preventing external water vapor from entering the driving function layer 32, thereby preventing the driving function layer 32 from being affected by the water vapor. The semiconductor layer 322 is located on the side of the third insulating layer 321 away from the substrate 1. A material of the semiconductor layer 322 includes at least one of indium gallium zinc oxide (IGZO), indium gallium titanium oxide (IGTO), or indium gallium zinc titanium oxide (IGZTO).

In detail, the semiconductor layer 322 includes a channel region, and a source electrode region and a drain electrode region respectively located on two sides of the channel region. The source electrode 3281 is electrically connected to the source electrode region through a source electrode contact hole penetrating the interlayer dielectric layer 327, the second gate insulating layer 325, and the first gate insulating layer 323. The drain electrode 3282 is electrically connected to the drain electrode region through a drain electrode contact hole penetrating the interlayer dielectric layer 327, the second gate insulating layer 325, and the first gate insulating layer 323.

In detail, the signal trace 3283 includes function signal lines, such as a data line, a scanning line, a driving voltage line, and a voltage transmission line, which are respectively configured to transmit a data signal, a scanning signal, a driving voltage signal, and a voltage transmission signal. For example, when the signal trace 3283 is the data line, the signal trace is configured to transmit the data signal to the LED chips 20 by using the second metal layer 312.

It is to be noted that, a structure of a single thin film transistor in the driving function layer 32 is not limited to a double gate structure provided in the embodiments of the present disclosure. Those skilled in the art may select other structure forms, such as a single gate structure. Details are not described herein.

Figure 2:
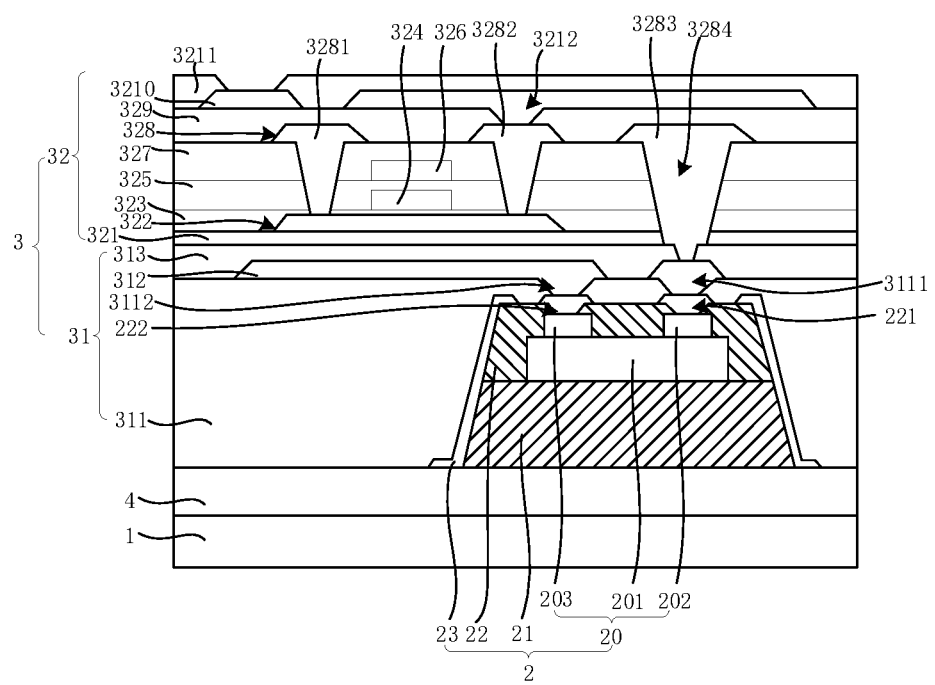
FIG. 2 is a schematic diagram of a cross-sectional structure of another display panel according to an embodiment of the present disclosure.
Figure 3:
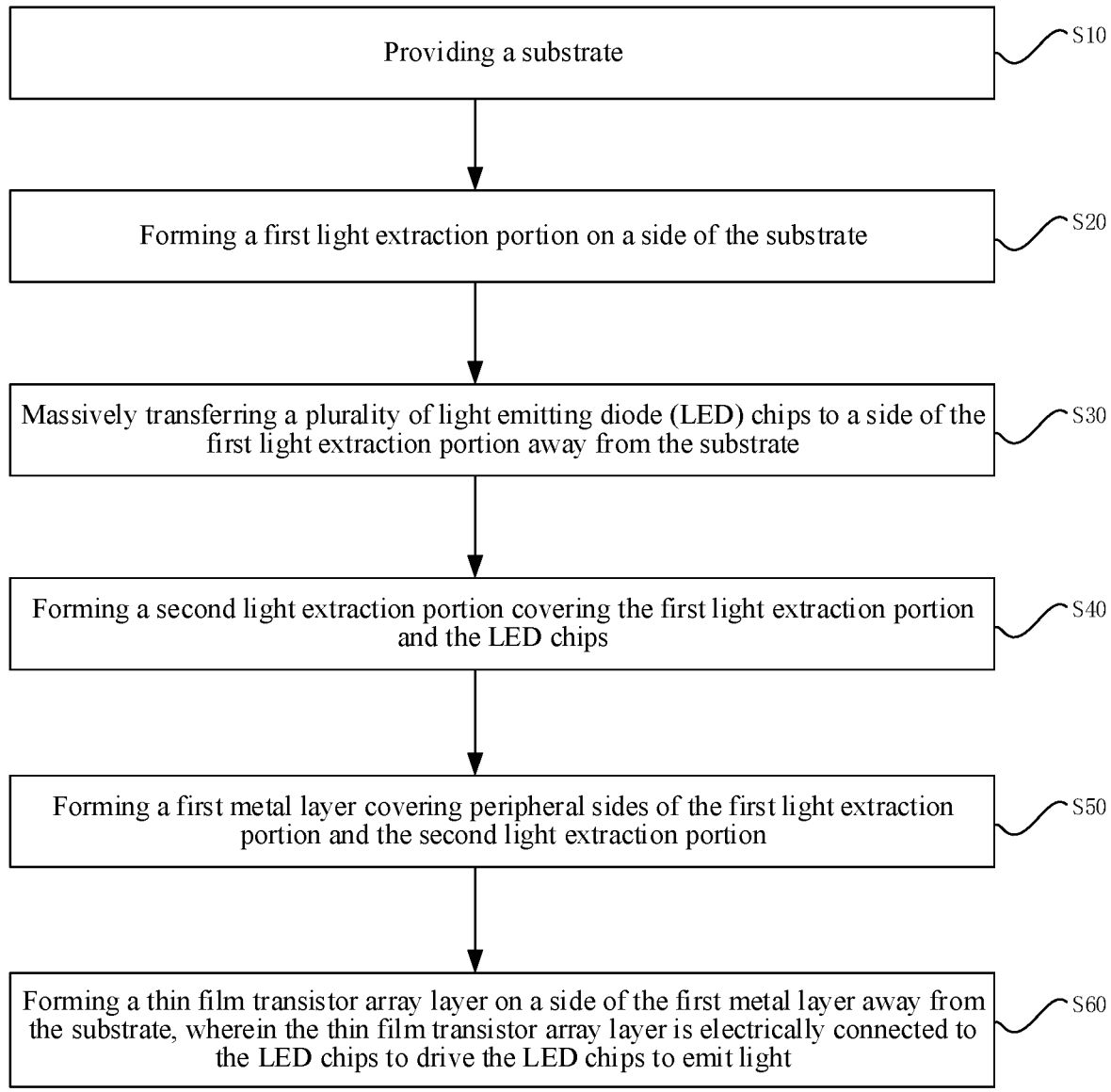
FIG. 3 is a flowchart of a method for manufacturing a display panel according to an embodiment of the present disclosure.

Further, referring to FIG. 2, FIG. 2 is a schematic diagram of a cross-sectional structure of another display panel according to an embodiment of the present disclosure. In order to reduce a voltage drop, the driving function layer 32 may also be designed to include two source/drain electrode metal layers. In detail, the driving function layer 32 further includes a second source/drain electrode metal layer 3210 and a second planarization layer 3211. The second source/drain electrode metal layer 3210 is located on a side of the first planarization layer 329 away from the substrate 1. The second source/drain electrode metal layer 3210 is electrically connected to the drain electrode 3282 through a via penetrating the first planarization layer 329. The second planarization layer 3211 covers the first planarization layer 329 and the second source/drain electrode metal layer 3210. The second source/drain electrode metal layer 3210 is electrically connected to one of the source electrode 3281 or the drain electrode 3282 through a sixth via 3212 penetrating the first planarization layer 329.

In the present embodiment of the present disclosure, a fourth insulating layer 4 is further disposed between the substrate 1 and the light extraction structure 2, to prevent external water vapor from entering the LED chips 20 and cause a failure of the light emitting units 201.

Further, a refractive index of the fourth insulating layer 4 is less than a refractive index of the first light extraction portion 21. Therefore, a part of light emitted by the LED chips 20 is totally reflected at borders of the first light extraction portion 21 and the fourth insulating layer 4, thereby further enhancing the light exit efficiency of the LED chip 20.

Referring to FIG. 3 and FIGS. 4A to 4I, FIG. 3 is a flowchart of a method for manufacturing a display panel according to an embodiment of the present disclosure, and FIGS. 4A to 4I are schematic diagrams of a process and a structure of the method for manufacturing a display panel according to an embodiment of the present disclosure.

An embodiment of the present disclosure provides a method for manufacturing a display panel. The method includes steps as follows:

S10: Providing a substrate 1.

S20: Forming a first light extraction portion 21 on a side of the substrate 1.

S30: Massively transferring a plurality of LED chips 20 to a side of the first light extraction portion 21 away from the substrate 1.

S40: Forming a second light extraction portion 22 covering the first light extraction portion 21 and the LED chips 20.

S50: Forming a first metal layer 23 covering peripheral sides of the first light extraction portion 21 and the second light extraction portion 22.

S60: Forming a thin film transistor array layer 3 on a side of the first metal layer 23 away from the substrate 1, wherein the thin film transistor array layer 3 is electrically connected to the LED chips 20 to drive the LED chips 20 to emit light.

Figure 4A:
FIGS. 4A to 4I are schematic diagrams of a process and a structure of the method for manufacturing a display panel according to an embodiment of the present disclosure.

In detail, referring to FIG. 4A, in step S10, the substrate 1 is provided, and a fourth insulating layer 4 is formed on a side of the substrate 1.

Figure 4B:
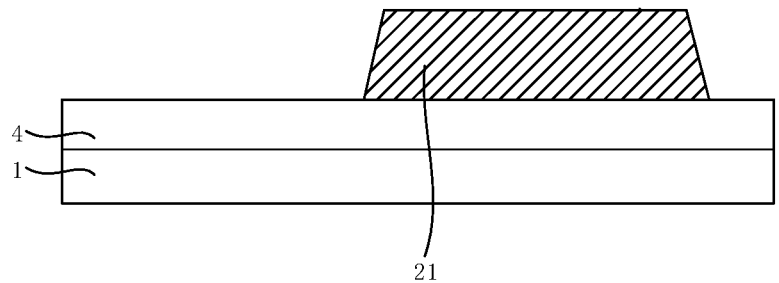

In detail, referring to FIG. 4B, in step S20, the first light extraction portion 21 may be formed on the side of the substrate 1 by using a yellow light process. The first light extraction portion 21 may include a single layer or a plurality of layers. The first light extraction portion 21 may be made of an inorganic material or an organic material. For example, the inorganic material includes silicon oxide or silicon nitride or a multilayer thin film structure, and the organic material includes polyimide. In the present embodiment of the present disclosure, a thickness of the first light extraction portion 21 ranges from 1 micron to 30 microns.

Figure 4C:
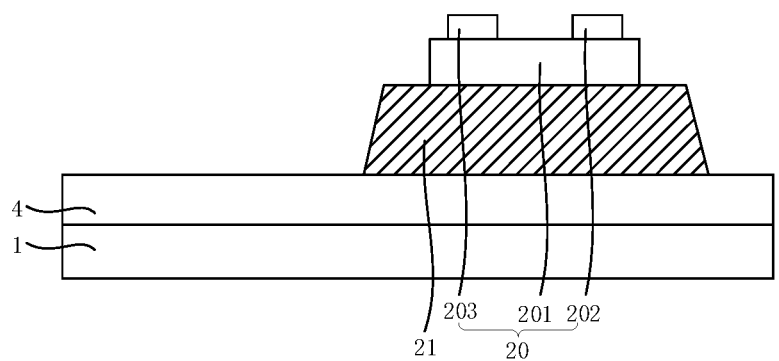

In detail, referring to FIG. 4C, in step S30, each of the LED chips 20 includes a light emitting unit 201 and a first electrode 202 and a second electrode 203 that are disposed on a side of the light emitting unit 201 away from the substrate 1. In the present embodiment of the present disclosure, the first electrode 202 is a P electrode, and the second electrode 203 is an N electrode.

Further, after the step of forming the second light extraction portion 22, the manufacturing method further includes steps as follows: S301: Inspecting the plurality of LED chips 20, determining whether there is a faulty LED chip, and if so, repairing the faulty LED chip.

It may be understood that, in the present disclosure, the LED chips 20 are inspected before the thin film transistor array layer 3 is manufactured. In the prior art, the LED chips 20 are inspected after mass transfer of the LED chips 20 to the thin film transistor array layer 3, and if a faulty LED chip is detected, which is irreparable, the entire display panel is scrapped. Therefore, compared with the prior art, the production cost can be greatly reduced.

Figure 4D:
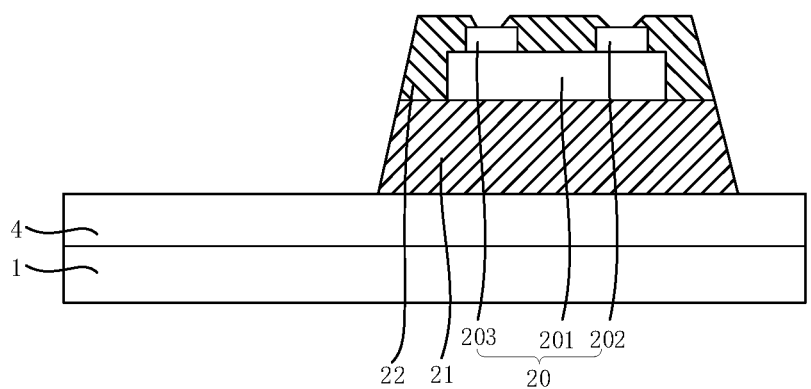

In detail, referring to FIG. 4D, in step S40, the second light extraction portion 22 may be first formed using the yellow light process, and then a first via 221 and a second via 222 penetrating the second light extraction portion 22 are formed using the yellow light process. A surface on a side of the first electrode 202 away from the substrate 1 is exposed from the first via 221. A surface on a side of the second electrode 203 away from the substrate 1 is exposed from the second via 222.

Optionally, the second light extraction portion 22 may include a single layer or a plurality of layers. The first light extraction portion 21 may be made of an inorganic material or an organic material.

Figure 4E:
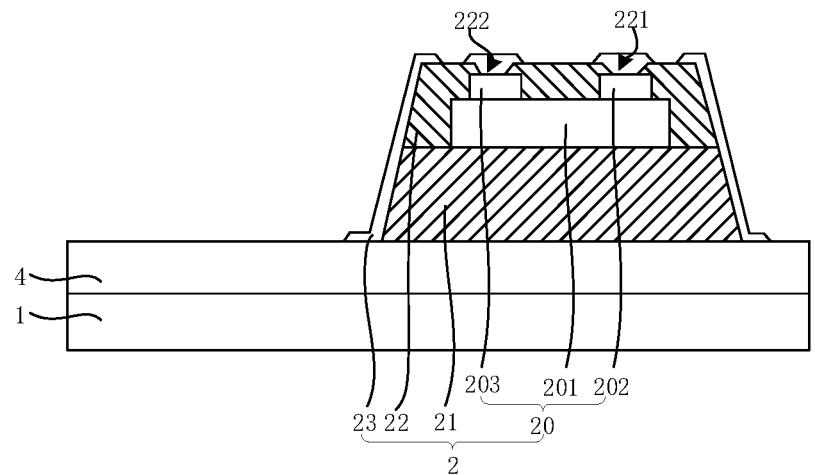

In detail, referring to FIG. 4E, in step S50, the first metal layer 23 may be formed using the yellow light process.

In detail, step S50 of forming the thin film transistor array layer 3 on the side of the first metal layer 23 away from the substrate 1 includes steps as follows:

S501: Forming a bonding connection layer 31 on a side of the first metal layer 23 away from the substrate 1.

S502: Forming a driving function layer 32 on a side of the bonding connection layer 31 away from the substrate 1, wherein the driving function layer 32 is electrically connected to the LED chips 20 using the bonding connection layer 31.

Figure 4F:
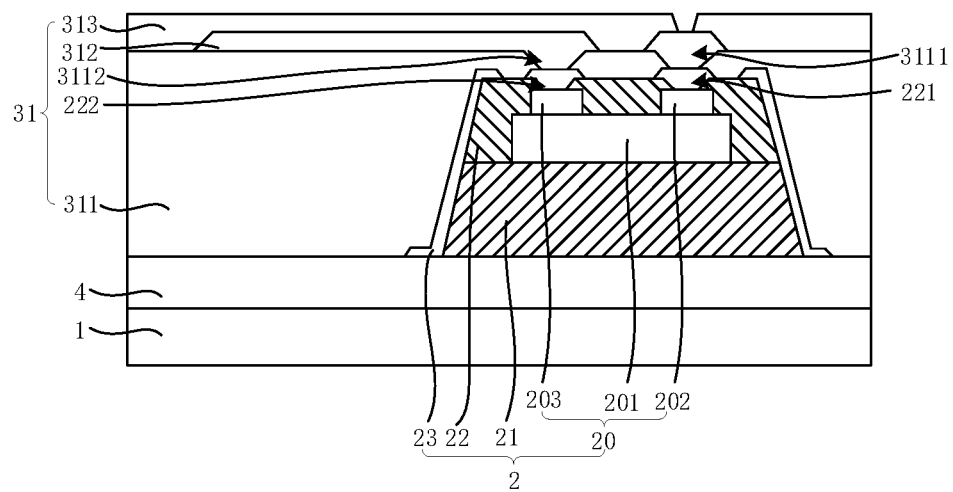

In detail, referring to FIG. 4F, in step S501, a first insulating layer 311 is first formed on the side of the first metal layer 23 away from the substrate 1, wherein the first insulating layer 311 covers the substrate 1 and the first metal layer 23, and a third via 3111 and a fourth via 3112 penetrating the first insulating layer 311 are formed using the yellow light process, next, a second metal layer 312 is formed on a side of the first insulating layer 311 away from the substrate 1, wherein the second metal layer 312 is electrically connected to the first metal layer 23 by through the third via 3111 and the fourth via 3112, and then a second insulating layer 313 covering the first insulating layer 311 and the second metal layer 312 is formed.

In detail, step S502 includes steps as follows:

S5021: Forming a third insulating layer 321 on a side of the second insulating layer 313 away from the substrate 1.

S5022: Forming a semiconductor layer 322 on a side of the third insulating layer 321 away from the substrate 1.

S5023: Forming a first gate insulating layer 323 covering the third insulating layer 321 and the semiconductor layer 322.

S5024: Forming a first gate layer 324 on a side of the first gate insulating layer 323 away from the substrate 1.

S5025: Forming a second gate insulating layer 325 covering the first gate layer 324 and the first gate insulating layer 323.

S5026: Forming a second gate layer 326 on the side of the first gate insulating layer 323 away from the substrate 1.

S5027: Forming an interlayer dielectric layer 327 covering the second gate layer 326 and the second gate insulating layer 325.

S5028: Forming a first source/drain electrode metal layer 328 on a side of the interlayer dielectric layer 327 away from the substrate 1, wherein the first source/drain electrode metal layer 328 includes a source electrode 3281, a drain electrode 3282, and a signal trace 3283, wherein the signal trace 3283 is electrically connected to the second metal layer 312 through a fifth via 3284 penetrating the interlayer dielectric layer 327, the second gate insulating layer 325, the first gate insulating layer 323, and the third insulating layer 321, wherein the fifth via 3284 is in communication with the fourth via 3112.

S5029: Forming a first planarization layer 329 covering the interlayer dielectric layer 327 and the first source/drain electrode metal layer 328.

Figure 4G:
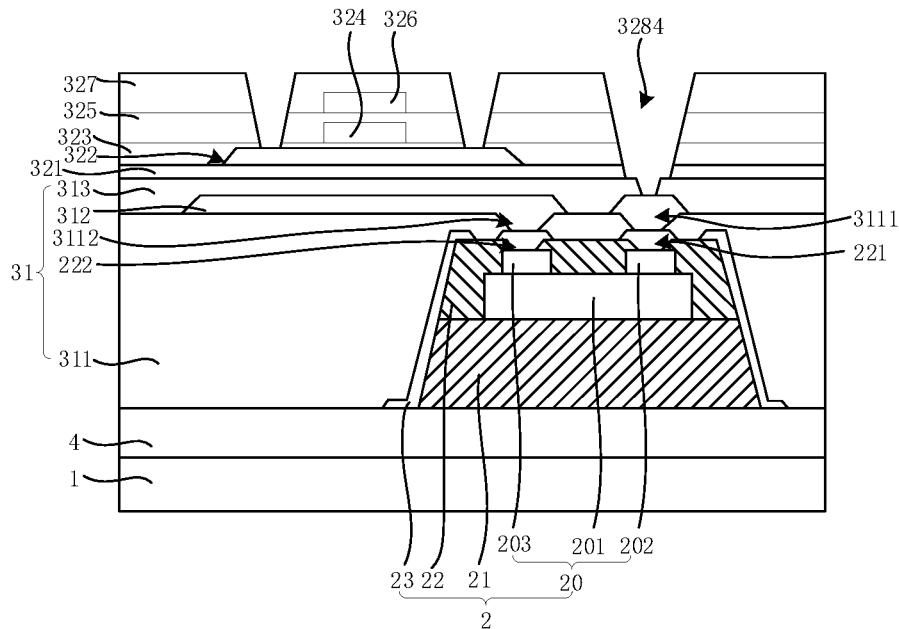

In detail, referring to FIG. 4G, after step S5027, a source electrode contact hole, a drain electrode contact hole, and a fifth via 3284 may be formed using the yellow light process. The source electrode 3281 is electrically connected to a source electrode region of the semiconductor layer 322 through the source electrode contact hole. The drain electrode 3282 is electrically connected to a drain electrode region of the semiconductor layer 322 through the drain electrode contact hole. The fifth via 3284 penetrates the interlayer dielectric layer 327, the second gate insulating layer 325, the first gate insulating layer 323, and the third insulating layer 321.

Figure 4H:
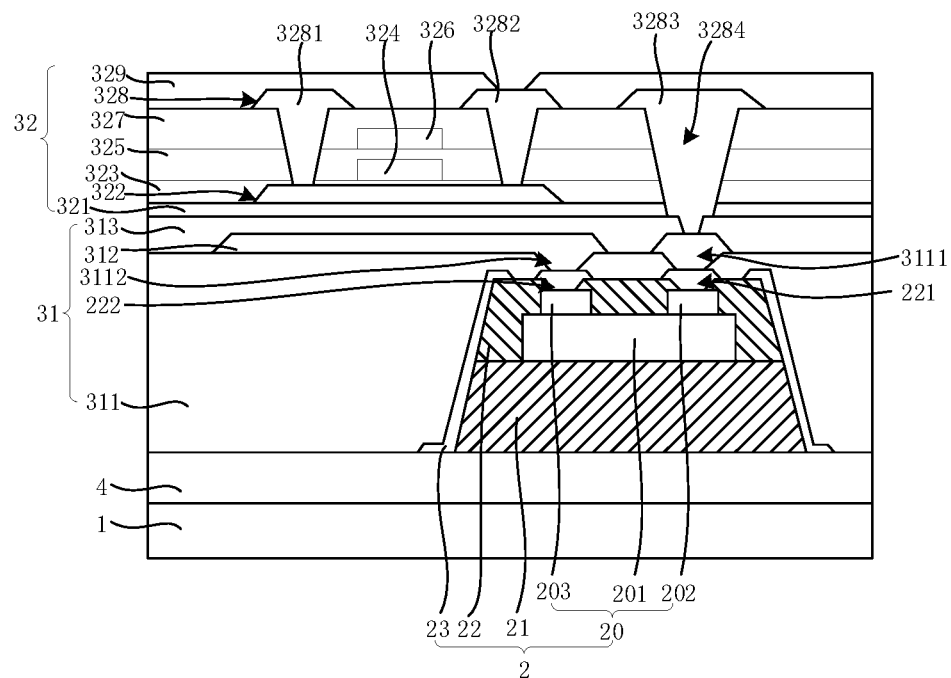

Referring to FIG. 4H, in step S5027 and step S5028, the interlayer dielectric layer 327 and the first source/drain electrode metal layer 328 are formed.

Figure 4I:
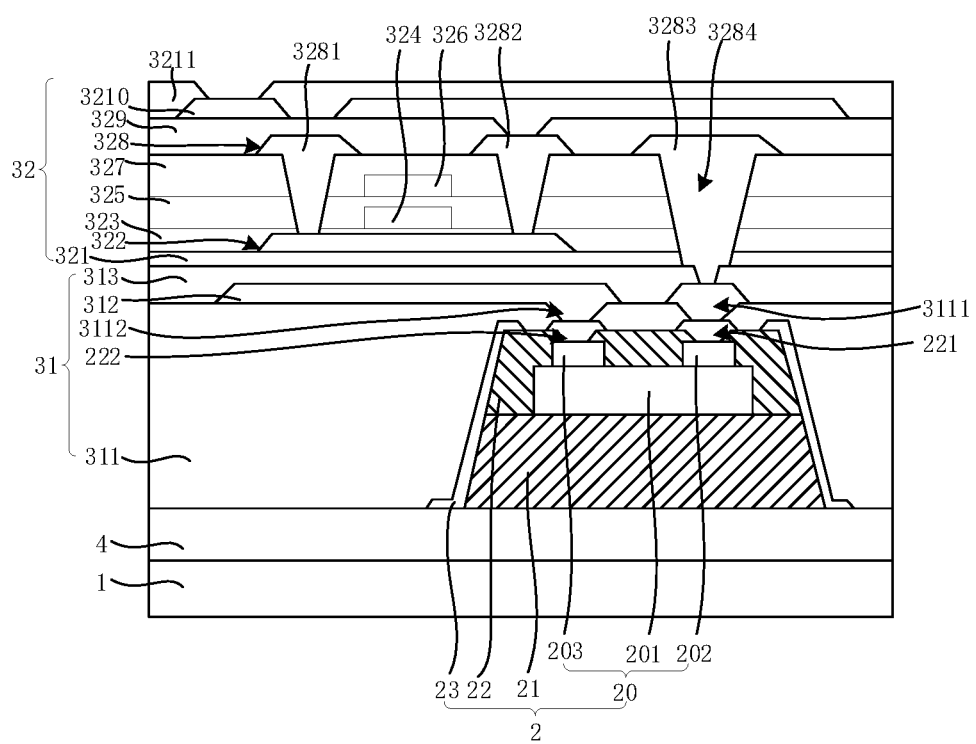

Further, referring to FIG. 4I, after step S5029, the method further includes: forming a second source/drain electrode metal layer 3210 on a side of the first planarization layer 329 away from the substrate 1, wherein the second source/drain electrode metal layer 3210 is electrically connected to the drain electrode 3282 through a via penetrating the first planarization layer 329; and forming a second planarization layer 3211 covering the first planarization layer 329 and the second source/drain electrode metal layer 3210 is formed.

The beneficial effects are as follows: In the embodiments of the present disclosure, the light extraction structure is disposed. By means of the first light extraction portion, the second light extraction portion, and the first metal layer of the light extraction structure, light emitted by the LED chips achieves total reflection after passing through the first light extraction portion and the second light extraction portion and then irradiating a sidewall of the first metal layer. In this way, the light exit efficiency at the front viewing angle can be effectively enhanced, the power consumption of the display panel is reduced, and the service time of a device is prolonged.

In conclusion, although the present disclosure has been described with reference to the above embodiments, the embodiments are not intended to limit the present disclosure. A person skilled in the art can make various changes and modifications without departing from the spirit and the scope of the present disclosure. Therefore, the protection scope of the present disclosure should be subject to the scope defined by the claims.

What is claimed is:

1. A display panel, comprising:
   a substrate;
   a light extraction structure disposed on a side of the substrate and comprising: silicon oxide, silicon nitride, or a multilayer film structure;
   a first light extraction portion disposed on the substrate;
   a plurality of light emitting diode (LED) chips located on a side of the first light extraction portion away from the substrate;
   a second light extraction portion covering the first light extraction portion and the LED chips; and
   a first metal layer covering peripheral sides of the first light extraction portion and the second light extraction portion; and
   a thin film transistor array layer disposed on a side of the first metal layer away from the substrate, wherein the thin film transistor array layer is electrically connected to the LED chips to drive the LED chips to emit light.

2. The display panel as claimed in claim 1, wherein each of the LED chips comprises a light emitting unit and a first electrode and a second electrode that are disposed on a side of the light emitting unit away from the substrate, the first metal layer is electrically connected to the first electrode through a first via penetrating the second light extraction portion, and the first metal layer is electrically connected to the second electrode through a second via penetrating the second light extraction portion.

3. The display panel as claimed in claim 2, wherein the thin film transistor array layer comprises a bonding connection layer and a driving function layer, wherein the bonding connection layer is located on a side of the light extraction structure away from the substrate, and the driving function layer is located on a side of the bonding connection layer away from the substrate and is electrically connected to the LED chips using the bonding connection layer.

4. The display panel as claimed in claim 3, wherein the bonding connection layer comprises:
   a first insulating layer covering the substrate and the first metal layer;
   a second metal layer located on a side of the first insulating layer away from the substrate, wherein the second metal layer is electrically connected to the first metal layer through a third via and a fourth via penetrating the first insulating layer; and
   a second insulating layer covering the first insulating layer and the second metal layer, wherein the driving function layer is located on a side of the second insulating layer away from the substrate.

5. The display panel as claimed in claim 4, wherein the second metal layer comprises a positive electrode trace and a low-potential power signal line that are spaced apart from each other, wherein the positive electrode trace is electrically connected to the first electrode through the third via, and the low-potential power signal line is electrically connected to the second electrode through the fourth via.

6. The display panel as claimed in claim 4, wherein the driving function layer comprises:
   a third insulating layer located on the side of the second insulating layer away from the substrate;
   a semiconductor layer located on a side of the third insulating layer away from the substrate;
   a first gate insulating layer covering the third insulating layer and the semiconductor layer;
   a first gate layer located on a side of the first gate insulating layer away from the substrate;

a second gate insulating layer covering the first gate layer and the first gate insulating layer;

a second gate layer located on the side of the first gate insulating layer away from the substrate;

an interlayer dielectric layer covering the second gate layer and the second gate insulating layer;

a first source/drain electrode metal layer located on a side of the interlayer dielectric layer away from the substrate, wherein the first source/drain electrode metal layer comprises a source electrode, a drain electrode, and a signal trace, wherein the signal trace is electrically connected to the second metal layer through a fifth via penetrating the interlayer dielectric layer, the second gate insulating layer, the first gate insulating layer, and the third insulating layer, wherein the fifth via is in communication with the fourth via; and a first planarization layer covering the interlayer dielectric layer and the first source/drain electrode metal layer.

7. The display panel as claimed in claim 6, wherein the driving function layer comprises:

a second source/drain electrode metal layer located on a side of the first planarization layer away from the substrate, wherein the second source/drain electrode metal layer is electrically connected to one of the source electrode or the drain electrode through a sixth via penetrating the first planarization layer; and a second planarization layer covering the first planarization layer and the second source/drain electrode metal layer.

8. The display panel as claimed in claim 1, wherein the display panel further comprises a fourth insulating layer located between the light extraction structure and the substrate.

9. The display panel as claimed in claim 1, wherein a size of the first light extraction portion in a thickness direction of the display panel ranges from 1 micron to 30 microns.

10. The display panel as claimed in claim 1, wherein a size of the second light extraction portion in a thickness direction of the display panel ranges from 1 micron to 30 microns.

11. A display panel, comprising:

a substrate;

a light extraction structure disposed on a side of the substrate and comprising:

a first light extraction portion disposed on the substrate;

a plurality of light emitting diode (LED) chips located on a side of the first light extraction portion away from the substrate;

a second light extraction portion covering the first light extraction portion and the LED chips; and a first metal layer covering peripheral sides of the first light extraction portion and the second light extraction portion; and a thin film transistor array layer disposed on a side of the first metal layer away from the substrate, wherein the thin film transistor array layer is electrically connected to the LED chips to drive the LED chips to emit light.

12. The display panel as claimed in claim 11, wherein each of the LED chips comprises a light emitting unit and a first electrode and a second electrode that are disposed on a side of the light emitting unit away from the substrate, the first metal layer is electrically connected to the first electrode through a first via penetrating the second light extraction portion, and the first metal layer is electrically connected to the second electrode through a second via penetrating the second light extraction portion.

13. The display panel as claimed in claim 12, wherein the thin film transistor array layer comprises a bonding connection layer and a driving function layer, wherein the bonding connection layer is located on a side of the light extraction structure away from the substrate, and the driving function layer is located on a side of the bonding connection layer away from the substrate and is electrically connected to the LED chips using the bonding connection layer.

14. The display panel as claimed in claim 13, wherein the bonding connection layer comprises:

a first insulating layer covering the substrate and the first metal layer;

a second metal layer located on a side of the first insulating layer away from the substrate, wherein the second metal layer is electrically connected to the first metal layer through a third via and a fourth via penetrating the first insulating layer; and a second insulating layer covering the first insulating layer and the second metal layer, wherein the driving function layer is located on a side of the second insulating layer away from the substrate.

15. The display panel as claimed in claim 14, wherein the driving function layer comprises:

a third insulating layer located on the side of the second insulating layer away from the substrate;

a semiconductor layer located on a side of the third insulating layer away from the substrate;

a first gate insulating layer covering the third insulating layer and the semiconductor layer;

a first gate layer located on a side of the first gate insulating layer away from the substrate;

a second gate insulating layer covering the first gate layer and the first gate insulating layer;

a second gate layer located on the side of the first gate insulating layer away from the substrate;

an interlayer dielectric layer covering the second gate layer and the second gate insulating layer;

a first source/drain electrode metal layer located on a side of the interlayer dielectric layer away from the substrate, wherein the first source/drain electrode metal layer comprises a source electrode, a drain electrode, and a signal trace, wherein the signal trace is electrically connected to the second metal layer though a fifth via penetrating the interlayer dielectric layer, the second gate insulating layer, the first gate insulating layer, and the third insulating layer, wherein the fifth via is in communication with the fourth via; and a first planarization layer covering the interlayer dielectric layer and the first source/drain electrode metal layer.

16. The display panel as claimed in claim 15, wherein the driving function layer comprises:

a second source/drain electrode metal layer located on a side of the first planarization layer away from the substrate, wherein the second source/drain electrode metal layer is electrically connected to one of the source electrode or the drain electrode through a sixth via penetrating the first planarization layer; and a second planarization layer covering the first planarization layer and the second source/drain electrode metal layer.

17. The display panel as claimed in claim 11, further comprising a fourth insulating layer located between the light extraction structure and the substrate.

18. The display panel as claimed in claim 11, wherein a size of the first light extraction portion in a thickness direction of the display panel ranges from 1 micron to 30 microns.

19. A method for manufacturing a display panel, comprising following steps:
   providing a substrate;
   forming a first light extraction portion on a side of the substrate;
   massively transferring a plurality of light emitting diode (LED) chips to a side of the first light extraction portion away from the substrate;
   forming a second light extraction portion covering the first light extraction portion and the LED chips; and
   forming a first metal layer covering peripheral sides of the first light extraction portion and the second light extraction portion; and
   forming a thin film transistor array layer on a side of the first metal layer away from the substrate, wherein the thin film transistor array layer is electrically connected to the LED chips to drive the LED chips to emit light.

20. The manufacturing method as claimed in claim 19, wherein before the step of forming the second light extraction portion, the manufacturing method further comprises following steps:
   inspecting the plurality of LED chips, determining whether there is a faulty LED chip, and if so, repairing the faulty LED chip.

* * * * *